(12) United States Patent
Vekris et al.

(10) Patent No.: US 6,365,493 B1
(45) Date of Patent: Apr. 2, 2002

(54) METHOD FOR ANTIMONY AND BORON DOPING OF SPHERICAL SEMICONDUCTORS

(75) Inventors: Evangellos Vekris; Nainesh J. Patel; Murali Hanabe, all of Plano, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/490,650

(22) Filed: Jan. 24, 2000

(51) Int. Cl.[7] .............................................. H01L 21/38
(52) U.S. Cl. ...................... 438/558; 438/560; 438/563; 438/564
(58) Field of Search ................ 438/558, 559, 438/560, 561, 563, 564, 918, 962

(56) References Cited

U.S. PATENT DOCUMENTS

| | | | |
|---|---|---|---|
| 3,852,128 A | * 12/1974 | Kreuzer | 148/189 |
| RE31,473 E | 12/1983 | Kilby et al. | 425/6 |
| 4,425,408 A | * 1/1984 | Levine et al. | 428/403 |
| 4,490,192 A | * 12/1984 | Gupta et al. | 148/188 |
| 4,734,386 A | * 3/1988 | Kubota et al. | 437/160 |
| 4,749,615 A | 6/1988 | Bonny et al. | 428/312.6 |
| 5,223,452 A | 6/1993 | Knepprath | 437/165 |
| 5,278,097 A | 1/1994 | Hotchkiss et al. | 437/164 |
| 5,462,639 A | 10/1995 | Matthews et al. | 156/662.1 |
| 5,560,543 A | 10/1996 | Smith et al. | 239/102.2 |
| 6,120,602 A | 9/2000 | Stephens et al. | 117/200 |

FOREIGN PATENT DOCUMENTS

| | | | |
|---|---|---|---|
| JP | 02-119241 | 10/1988 | |
| JP | 406310364 A | * 11/1994 | H01G/04/12 |

OTHER PUBLICATIONS

Wolf, S. and Tauber, R. "Silicon Processing for the VLSI Era" vol. 1, Process Technology, Lattice Press, 1986, pp. 266.*

* cited by examiner

Primary Examiner—Matthew Smith
Assistant Examiner—Renzo N. Rocchegiani
(74) Attorney, Agent, or Firm—Haynes and Boone LLP

(57) ABSTRACT

A method for doping crystals is disclosed. The method includes a receiver for receiving semiconductor spheres and doping powder. The semiconductor spheres and dopant powder are then directed to a chamber defined within an enclosure. The chamber maintains a heated, inert atmosphere with which to diffuse the dopant to the semiconductor spheres.

15 Claims, 3 Drawing Sheets

METHOD FOR ANTIMONY AND BORON DOPING OF SPHERICAL SEMICONDUCTORS

BACKGROUND OF THE INVENTION

The invention relates generally to semiconductor devices, and more particularly, to a method for doping spherical-shaped semiconductors.

The doping process involves the controlled introduction of an impurity to a substrate, which produces subtle changes in the electrical resistivity of the material. Such characteristics are necessary for solid-state electronic semiconductor devices, such as the transistor.

In the conventional semiconductor industry, a doped silicon substrate is created by adding the doping impurity directly into the melt during the crystal-pulling process. The final crystal is a uniformly doped one, from which wafers may be cut to serve as doped substrates.

In the case of spherical semiconductors, the single crystal substrates are not produced from a melt, but rather are made by remelting polycrystalline silicon granules which are grown by gas-phase reaction in a fluidized bed reactor. The random and turbulent nature of the fluidized bed process makes the attainment of sample-to-sample doping uniformity difficult. Therefore, the granules cannot be doped during growth in the fluidized bed, and must be doped by external means.

In U.S. Pat. Nos. 5,278,097, 5,995,776, and 5,223,452, methods and apparatuses for doping spherical-shaped semiconductors are disclosed. However, an improved method of doping the spherical shaped semiconductors, which is simpler and more economical, is desired.

SUMMARY OF THE INVENTION

The present invention, accordingly, provides a method for doping spherical semiconductors. To this end, one embodiment provides a receiver for receiving semiconductor spheres and a dopant powder. The semiconductor spheres and dopant powder are then directed to a chamber defined within an enclosure. The chamber maintains a heated, inert atmosphere with which to diffuse the dopant properties of the dopant powder into the semiconductor spheres.

In one embodiment, the method of doping a plurality of spherical shaped semiconductors includes: embedding the plurality of spherical shaped semiconductors in a dopant mixture to produce a powder mixture; heating the powder mixture to produce a plurality of doped spherical shaped semiconductors; cooling the doped spherical shaped semiconductors; removing the doped spherical shaped semiconductors from the powder mixture; and chemically etching the doped spherical shaped semiconductors.

In one embodiment, the plurality of spherical shaped semiconductors are made from a commercially available semiconductor material.

In one embodiment, the plurality of spherical shaped semiconductors are p-type spherical single crystal substrates.

In one embodiment, the plurality of spherical shaped semiconductors are n-type spherical single crystal substrates.

In one embodiment, the plurality of spherical shaped semiconductors are oxidized spherical shaped semiconductors.

In one embodiment, the dopant mixture is a mixture of a dopant oxide and silicon dioxide.

In one embodiment, the dopant mixture is a dopant nitride.

In one embodiment, the dopant mixture is a mixture of antimony oxide/silicon dioxide ($Sb_2O_3SiO_2$).

In one embodiment, the dopant mixture is a mixture of boric oxide/silicon dioxide ($B_2O_3SiO_2$).

In one embodiment, heating the powder mixture comprises diffusion and/or viscous flow along the surface of the spherical shaped semiconductors.

In one embodiment, the dopant mixture is boron nitride (BN).

In one embodiment, the method is done in a non-oxidizing environment.

In one embodiment, the method further includes melting the doped spherical shaped semiconductors to produce uniformly doped spherical shaped semiconductors and cooling the uniformly doped spherical shaped semiconductors.

DESCRIPTION OF THE PREFERRED EMBODIMENT

The present invention provides a method for doping substrates. The following description provides many different embodiments, or examples, for implementing different features of the invention. Certain techniques and components described in these different embodiments may be combined to form more embodiments. Also, specific examples of components, chemicals, and processes are described to help clarify the invention. These are, of course, merely examples and are not intended to limit the invention from that described in the claims.

Figure 1:
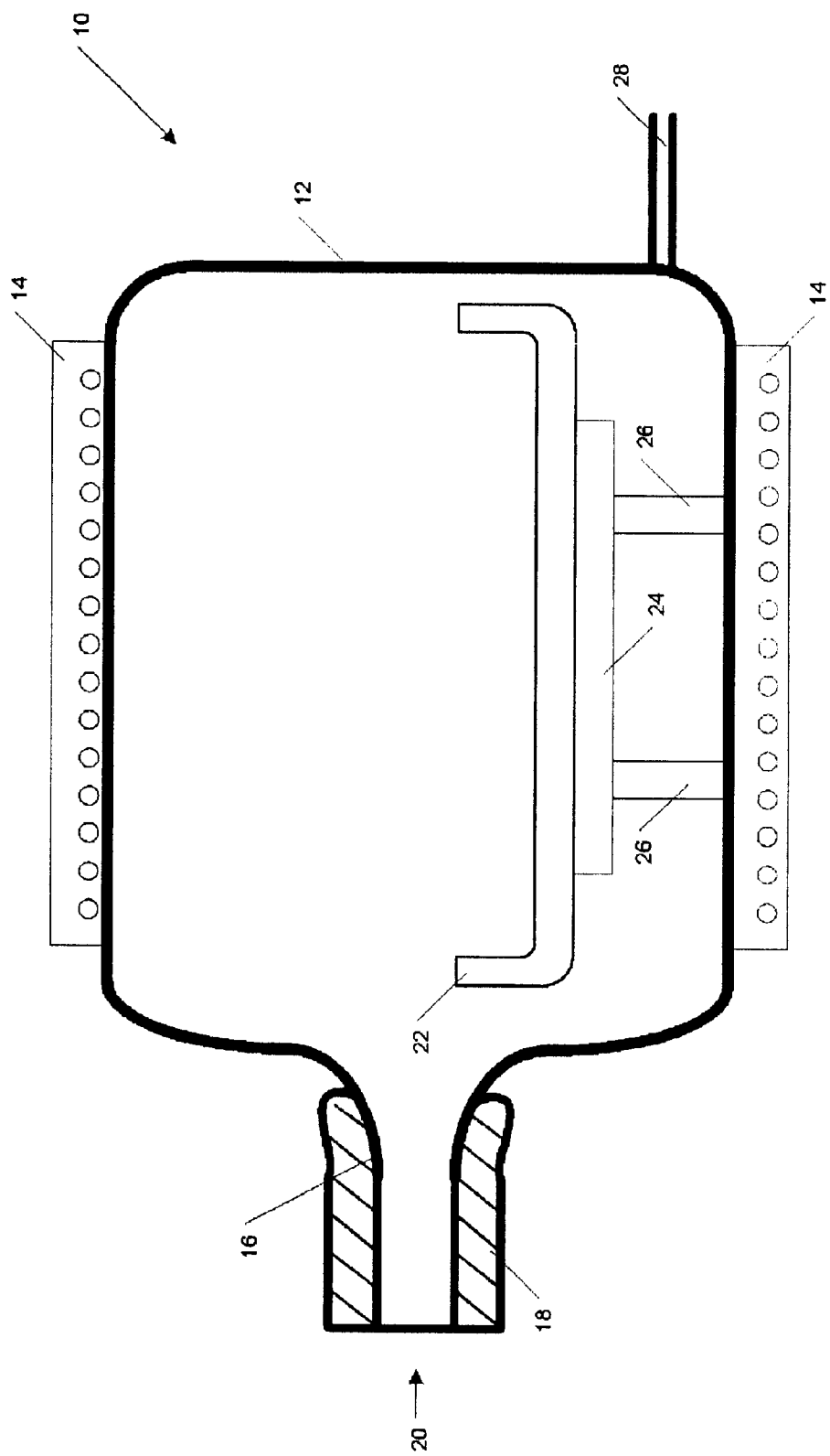
FIG. 1 is a cross-sectional view of an apparatus for use in doping spherical semiconductors according to one embodiment of the present invention.

Referring to FIG. 1, the reference numeral 10 designates, in general, one embodiment of an apparatus used for the doping of spherical semiconductors. The apparatus 10 includes a chamber 12 having a furnace 14 surrounding the chamber. The chamber 12 has an inlet port 16 at one end for connecting to an inlet line 18.

The inlet line 18 is used for allowing a gas source 20 to enter the chamber 12. The chamber 12 includes a boat 22 which can be held in place by a base 24 which is connected to one or more legs 26. The boat 22 may be, for example, quartz or alumina. In a preferred embodiment, the boat 22 is quartz. The chamber 12 also includes an outlet line 28 for exhausting the gas source 20.

Figure 2:
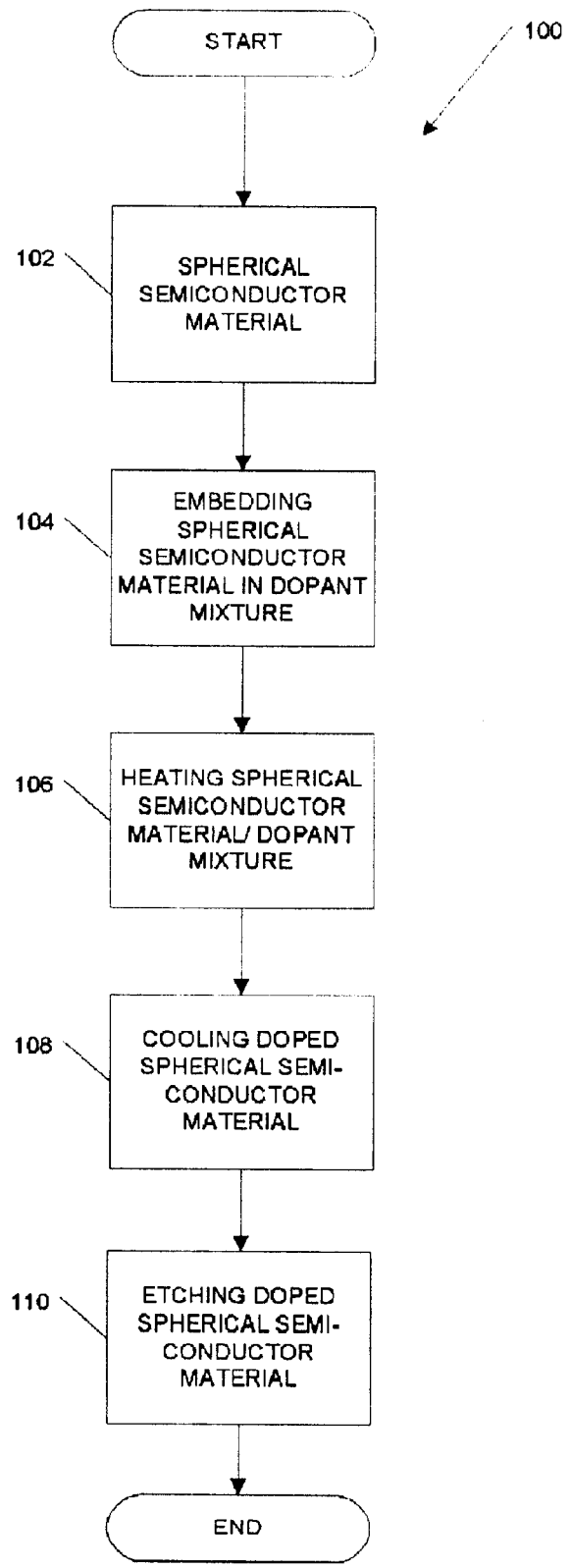
FIG. 2 is a flow chart of a method for doping a spherical shaped semiconductor using the apparatus of FIG. 1.
Figure 3:
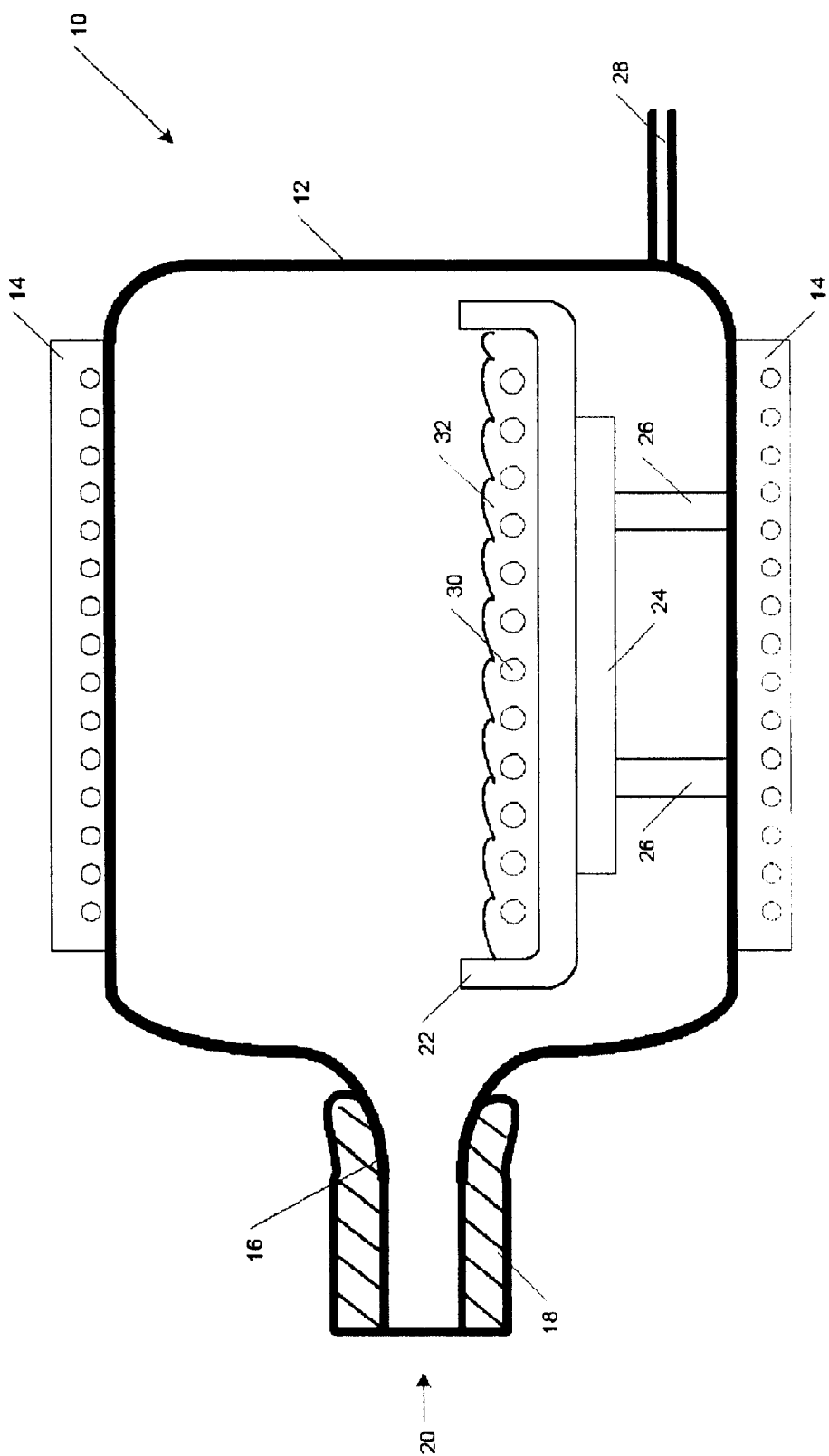
FIG. 3 is a cross-sectional view of the apparatus of FIG. 1 in use during the method of FIG. 2.

Referring to FIGS. 2 and 3, a method 100 may be used in conjunction with the apparatus 10. The method 100 is preferably performed in an inert atmosphere. At step 102, a plurality of spherical semiconductors 30 is placed in the boat 22. The spherical semiconductors 30 may be, for example, any commercially available spherical semiconductor material, any oxidized spherical semiconductor material, an n-type spherical single crystal substrate, or a p-type spherical single crystal substrate. In a preferred embodiment, the spherical semiconductors 30 are silicon.

At step 104, a dopant mixture 32 is placed in the boat 22 containing the spherical semiconductors 30. The spherical semiconductors 30 are embedded within the dopant mixture 32. The dopant mixture 32 preferably has particles that are approximately less than $1 \mu m$ in size. The dopant mixture 32 may be, for example, any dopant oxide mixed with silicon dioxide ($SiO_2$) or any dopant nitride. In a preferred embodiment, the dopant mixture 32 is an antimony oxide/silicon dioxide ($Sb_2O_3/SiO_2$) mixture. The ratio of the dopant oxide/silicon dioxide mixture is chosen to maximize the viscosity of the dopant mixture 32 and to maximize the amount of the dopant oxide in the dopant mixture 32.

At step 106, the boat 22 is placed within the chamber 12 and the chamber 12 is subjected to a predetermined thermal cycle. In a preferred embodiment, at the process temperature, antimony oxide is transferred from the dopant mixture 32 to the surface of the spherical semiconductors 30. This is accomplished by diffusion and/or viscous flow along the surface of the powder particles of the dopant mixture 32 which are in intimate contact with the spherical semiconductors 30. In a preferred embodiment, elemental antimony is further diffused to a shallow depth into the spherical semiconductors 30.

At step 108, the boat 22 is cooled and removed from the chamber 12. The spherical semiconductors 30 are doped with antimony and are removed from the dopant mixture 32.

At step 110, the spherical semiconductors 30 doped with antimony, are chemically etched to remove any oxide/powder layer. The spherical semiconductors 30 doped with antimony may be chemically etched by any commercially available chemical etching process.

In an alternate embodiment, the method 100 further includes melting the spherical semiconductors 30 doped with antimony to produce spherical semiconductors 30 uniformly doped with antimony upon cooling.

In an alternate embodiment of the method 100, the dopant mixture 32 is a boric oxide/silicon dioxide ($B_2O_3/SiO_2$) mixture. The spherical semiconductors 30 are doped with boron.

In an alternate embodiment of the method 100, the spherical semiconductors 30 are a p-type spherical single crystal substrate and the dopant mixture 32 is an antimony oxide/silicon dioxide ($Sb_2O_3/SiO_2$) mixture. The spherical semiconductors 30 are doped to produce a p-n junction near the surface of the spherical semiconductors 30.

In an alternate embodiment of the method 100, the spherical semiconductors 30 are an n-type spherical single crystal substrate and the dopant mixture 32 is a boron oxide/silicon dioxide ($B_2O_3/SiO_2$) mixture. The spherical semiconductors 30 are doped to produce a p-n junction near the surface of the spherical semiconductors 30.

In an alternate embodiment of the method 100, the spherical semiconductors 30 are oxidized spherical semiconductors and the dopant mixture 32 is boron nitride (BN).

Several advantages result from the above-described embodiments. For one, the spherical semiconductors seldom, if ever, come in physical contact with any other device or any part of the apparatus 10.

It is understood that several variations may be made in the foregoing. For example, different heating mechanisms may be used with the apparatus. Other modifications, changes and substitutions are also intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method of doping a plurality of three dimensional substrates, the method comprising the steps of:
   embedding the plurality of three dimensional substrates in a dopant powder to produce a powder mixture;
   heating the powder mixture to produce a plurality of doped three dimensional substrates;
   cooling the doped three dimensional substrates;
   removing the doped three dimensional substrates from the powder mixture; and
   etching the doped three dimensional substrates to remove any oxide powder layer.

2. The method of claim 1, wherein the plurality of three dimensional substrates are spherical shaped semiconductors.

3. The method of claim 2, wherein the plurality of spherical shaped semiconductors are p-type spherical single crystal substrates.

4. The method of claim 2, wherein the plurality of spherical shaped semiconductors are n-type spherical single crystal substrates.

5. The method of claim 2, wherein the plurality of spherical shaped semiconductors are oxidized spherical shaped semiconductors.

6. The method of claim 2, wherein the dopant powder is comprised of a dopant oxide and silicon dioxide.

7. The method of claim 2, wherein the dopant powder is a dopant nitride.

8. The method of claim 2, wherein the dopant powder is comprised of antimony oxide/silicon dioxide ($Sb_2O_3/SiO_2$).

9. The method of claim 2, wherein the dopant powder is comprised of boric oxide/silicon dioxide ($B_2O_3/SiO_2$).

10. The method of claim 2, wherein heating the powder mixture comprises diffusion and viscous flow along the surface of the spherical shaped semiconductors.

11. The method of claim 2, wherein heating the powder mixture comprises viscous flow along the surface of the spherical shaped semiconductors.

12. The method of claim 2, wherein the dopant powder is boron nitride (BN).

13. The method of claim 2, further comprising:
    providing a non-oxidizing environment during the heating step.

14. The method of claim 2, further comprising:
    melting the doped spherical shaped semiconductors to produce uniformly doped spherical shaped semiconductors; and
    cooling the uniformly doped spherical shaped semiconductors.

15. A method of doping a plurality of spherical silicon semiconductors, the method comprising the steps of:

placing a quantity of dopant oxide powder inside a boat positioned within a chamber having a heating element attached to the chamber;

embedding the plurality of spherical silicon semiconductors in a dopant oxide powder to produce a powder mixture;

heating the powder mixture in an inert atmosphere to transfer dopant oxide from the powder mixture to the surface of the spherical silicon semiconductors by effecting diffusion and viscous flow along the surface of the dopant oxide powder to produce a plurality of doped spherical silicon semiconductors;

further diffusing dopant to a shallow depth into the spherical silicon semiconductors;

cooling the doped spherical silicon semiconductors;

removing the boat from the chamber;

removing the doped spherical silicon semiconductors from the powder mixture; and etching the doped spherical silicon semiconductors to remove any oxide powder layer.

* * * * *